United States Patent
Sonderegger et al.

(10) Patent No.: US 10,933,936 B2
(45) Date of Patent: Mar. 2, 2021

(54) IN-FRAME MOUNTED BICYCLE MONITORING DEVICE

(71) Applicant: SPECIALIZED BICYCLE COMPONENTS, INC., Morgan Hill, CA (US)

(72) Inventors: Marco Sonderegger, Brenzenschwil (CH); Jan Talavasek, Knonau (CH); Tero Jakku, Bonstetten (CH); Vincent Patureau, Zürich (CH); Marc Pallure, Zug (CH); Jonas Reiter, Zug (CH)

(73) Assignee: SPECIALIZED BICYCLE COMPONENTS, INC., Morgan Hill (CA)

( * ) Notice: Subject to any disclaimer, the term of this patent is extended or adjusted under 35 U.S.C. 154(b) by 0 days.

(21) Appl. No.: 16/670,872

(22) Filed: Oct. 31, 2019

(65) Prior Publication Data
US 2020/0062327 A1 Feb. 27, 2020

Related U.S. Application Data

(62) Division of application No. 16/022,507, filed on Jun. 28, 2018, now Pat. No. 10,472,015.

(51) Int. Cl.
*B62J 99/00* (2020.01)
*G01R 31/371* (2019.01)
(Continued)

(52) U.S. Cl.
CPC .......... *B62J 99/00* (2013.01); *G01R 31/3648* (2013.01); *G01R 31/371* (2019.01);
(Continued)

(58) Field of Classification Search
CPC .... B62J 99/00; G01R 31/371; G01R 31/3648; G06F 1/1637; G06F 1/1656
(Continued)

(56) References Cited

U.S. PATENT DOCUMENTS

| | | |
|---|---|---|
| 5,178,033 A | 1/1993 | Kund |
| 5,798,702 A | 8/1998 | Okamoto et al. |

(Continued)

FOREIGN PATENT DOCUMENTS

| | | |
|---|---|---|
| DE | 202015002905 | 5/2015 |
| EP | 3281855 | 2/2018 |

(Continued)

OTHER PUBLICATIONS

Amazon, ArcEnCiel Water Resistant Front Top Tube Pannier Bike Frame Storage Bag Mobile Phone Holder ≤ 5.7" Screen, https://www.amazon.com/ArcEnCiel-Resistant-Pannier-Storage-Mobile/dp/B01ALIEWBS, accessed on Apr. 12, 2018, in 2 pages.

(Continued)

*Primary Examiner* — Hung T Nguyen
(74) *Attorney, Agent, or Firm* — Knobbe, Martens, Olson & Bear, LLP

(57) ABSTRACT

An electronic device can be mounted at least partly in a frame of a bicycle and used to monitor operations or properties of the bicycle or one or more components associated with the bicycle. The electronic device may integrate and communicate with a variety of components including sensors to facilitate customization of monitoring by the electronic device. The electronic device can have a relatively minimalist design. The electronic device, in some embodiments, may include a display that does not present alphanumeric characters to an operator, and the display may instead include multiple indicators that individually or in combination present information to the operator, such as the level of charge of one or more batteries or an operating mode of the electronic device or bicycle.

20 Claims, 11 Drawing Sheets

(51) Int. Cl.
*G01R 31/36* (2020.01)
*G06F 1/16* (2006.01)
*B62M 6/40* (2010.01)
*B62J 45/20* (2020.01)
*B62J 50/20* (2020.01)

(52) U.S. Cl.
CPC .......... *G06F 1/1637* (2013.01); *G06F 1/1656* (2013.01); *B62J 45/20* (2020.02); *B62J 50/20* (2020.02); *B62M 6/40* (2013.01)

(58) Field of Classification Search
USPC .......... 340/432, 636, 636.1, 636.11, 636.12, 340/691.6; 180/68.5, 220; 320/106, 132
See application file for complete search history.

(56) References Cited

U.S. PATENT DOCUMENTS

| | | | |
|---|---|---|---|
| 6,305,241 B1 | 10/2001 | Masui | |
| D472,834 S | 4/2003 | Ueda | |
| D499,973 S | 12/2004 | Okuda | |
| D499,974 S | 12/2004 | Okuda | |
| D522,394 S | 6/2006 | Okuda | |
| 7,165,641 B2* | 1/2007 | Kitamura | B60L 50/20 180/206.2 |
| D553,528 S | 10/2007 | Ueda | |
| D554,014 S | 10/2007 | Ueda | |
| D637,508 S | 5/2011 | Ueda | |
| D640,608 S | 6/2011 | Funabiki | |
| D645,371 S | 9/2011 | Ueda | |
| D665,685 S | 8/2012 | Okuda | |
| 8,305,742 B2 | 11/2012 | Onnela et al. | |
| D674,322 S | 1/2013 | Hilgart | |
| 8,364,389 B2 | 1/2013 | Dorogusker et al. | |
| D680,890 S | 4/2013 | Ueda | |
| 8,531,072 B2 | 9/2013 | Wishart | |
| D704,583 S | 5/2014 | Ueda | |
| D711,755 S | 8/2014 | Oasbach | |
| D727,768 S | 4/2015 | Nagano | |
| D743,824 S | 11/2015 | Lumme | |
| 9,194,955 B1* | 11/2015 | Fahrner | G01S 19/16 |
| D759,522 S | 6/2016 | Ueda | |
| 9,359,036 B2 | 6/2016 | Thompson | |
| D772,746 S | 11/2016 | Henne | |
| D777,591 S | 1/2017 | Haapakoski | |
| 9,580,140 B2* | 2/2017 | Talavasek | B62K 11/02 |
| 9,851,753 B2* | 12/2017 | Gao | G04G 17/045 |
| D810,733 S | 2/2018 | Kwak | |
| 10,086,708 B2 | 10/2018 | Ichida | |
| 10,093,379 B2 | 10/2018 | Hines | |
| 10,279,212 B2* | 5/2019 | Dalebout | A63B 21/156 |
| 10,472,013 B2* | 11/2019 | Pelot | G05D 7/0635 |
| 10,479,440 B2* | 11/2019 | Kishita | B62M 6/40 |
| 2009/0091292 A1* | 4/2009 | Nippear | H02J 7/0045 320/111 |
| 2010/0188250 A1* | 7/2010 | Kim | G08C 23/04 340/8.1 |
| 2012/0049483 A1 | 3/2012 | Dodman | |
| 2012/0083956 A1 | 4/2012 | Aoki | |
| 2016/0039496 A1 | 2/2016 | Hancock et al. | |
| 2017/0043829 A1 | 2/2017 | Li | |
| 2017/0134063 A1* | 5/2017 | Lee | H04M 1/04 |
| 2017/0327173 A1 | 11/2017 | Cooper | |
| 2018/0029658 A1 | 2/2018 | Boundy | |
| 2018/0281896 A1 | 10/2018 | Takeshita | |

FOREIGN PATENT DOCUMENTS

| | | |
|---|---|---|
| EP | 3296190 | 3/2018 |
| JP | H08-268361 | 10/1996 |
| JP | 2003116226 | 4/2003 |

OTHER PUBLICATIONS

BESV JS1 Features, http://www.besv.com/products/js1, accessed on Apr. 16, 2018, in 8 pages.

BikeRadar, Trail Tech: Garmin Mounts for Mountain Bikers, https://www.bikeradar.com/us/mtb/geadarticle/trail-tech-garmin-mounts-for-mountain-bikers-40528, dated Mar. 26, 2014, in 6 pages.

Stromer, Operating Manual, Version 3.0, dated Dec. 2016, in 38 pages.

YouTube, KT-LCD3 Display is a Must Have accessory for the Sondors Ebike, https://www.youtube.com/watch?v=dE3WcpC5IWE, accessed on Apr. 12, 2018, in 1 page.

Orbea Blue Papers Gain Technical Manual, dated Feb. 2018 (Applicant reserves right to challenge date of public availability), in 34 pages.

\* cited by examiner

IN-FRAME MOUNTED BICYCLE MONITORING DEVICE

RELATED APPLICATIONS

This application is a divisional of U.S. patent application Ser. No. 16/022,507, filed Jun. 28, 2018, now U.S. Pat. No. 10,472,015, entitled "IN-FRAME MOUNTED BICYCLE MONITORING DEVICE," the entirety of which is incorporated herein by reference.

TECHNICAL FIELD

The present technology relates to bicycles and, in particular, bicycle monitoring technology.

DESCRIPTION OF RELATED TECHNOLOGY

Electric bicycles generally include human machine interfaces for interacting with the electric bicycles. The human machine interfaces can enable operators to monitor the electric bicycles.

SUMMARY

The systems, methods and devices described herein have innovative aspects, no single one of which is indispensable or solely responsible for their desirable attributes. Without limiting the scope of the claims, some of the advantageous features will now be summarized.

In some embodiments, an electronic device is disclosed for monitoring operations or properties of a bicycle or a component attached to the bicycle. The electronic device can include: a housing configured to mount to a top tube of a bicycle so that a portion of the housing is within the top tube when the housing is mounted to the bicycle; no more than two user input elements configured to receive user inputs; a wireless interface supported by the housing and configured wirelessly communicate with other devices; a connector supported by the housing and configured to receive data indicative of operations or properties of the bicycle or a component attached to the bicycle; a processor positioned in the housing where the processor is configured to monitor the operations or the properties to determine status information and store at least some of the data to a memory device; and a display supported by the housing and configured to present the status information without using alphanumeric characters. The display may, for instance, not include a liquid-crystal display.

The electronic device of the preceding paragraph can include one or more of the following features: The display can include multiple light emitting diodes to present the status information. The no more than two user input elements can be two buttons, and the user inputs can include activation inputs, deactivation inputs, and settings adjustment inputs. The user inputs can include a reset input configured to reset system parameters, the reset input being received responsive to selection of at least one of the no more than two user input elements for a period of time during startup of the processor. The operations or the properties can include a speed, a cadence, a location, and a mode of the bicycle. The processor can output at least some of the data to another device via the wireless interface. The processor can communicate via a controller area network to monitor the operations or the properties. The processor can communicate with a remote control device via the connector. The electronic device can further include the remote control device, the remote control device including a switch configured to connect a data wire to ground when the switch is pressed; the remote control device not including any transistors. The housing may include no more than one hole that is configured to receive a fastener to secure the housing to the top tube. The portion can include a port configured to permit diagnosing or servicing of errors, and the housing can include a cover configured to selectively cover the port. The electronic device can further comprise the bicycle, the housing being configured to mount to the top tube so that any electrical connections supported by the housing are protected in the top tube from splashes of water external to the bicycle when the housing is mounted to the bicycle. Responsive to the bicycle turning on, the processor can automatically store at least some of the data to the memory device. The processor may not automatically store at least some of the data to the memory device until instructed by a user to automatically store at least some of the data to the memory device. The connector can receive power from the bicycle or the component.

In some embodiments, an electronic device is disclosed for monitoring levels of charge of a plurality of batteries associated with a bicycle. The electronic device can include: a housing configured to mount to a top tube of a bicycle so that a portion of the housing is within the top tube when the housing is mounted to the bicycle; a connector supported by the housing and configured to receive data indicative of a first level of charge of a first battery and a second level of charge of a second battery, the first battery and the second battery being associated with the bicycle; a processor positioned in the housing and configured to monitor the first level of charge and the second level of charge over time; and a display supported by the housing. The display can simultaneously present the first level of charge and the second level of charge over time such that: the first level of charge is overlaid on the second level of charge when the first level of charge is greater than the second level of charge, and the second level of charge is overlaid on the first level of charge when the first level of charge is less than the second level of charge.

The electronic device of the preceding paragraph can include one or more of the following features: Responsive to a user input, the display can present the first level of charge and the second level of charge for a period of time and then hide the first level of charge and the second level of charge upon expiration of the period time. The display can present the first level of charge and the second level of charge as a single combined indicator when the first level of charge is below a first threshold and the second level of charge is below a second threshold. The display can include multiple light emitting diodes configured to illuminate to present the first level of charge and the second level of charge. The first level of charge can be indicated by a first set of the multiple light emitting diodes having a first hue, and the second level of charge is indicated by a second set of the multiple light emitting diodes having a second hue different from the first hue. The first level of charge can be presented on a scale different from the second level of charge. The first battery and the second battery can be supported by the bicycle and power the bicycle or one or more components supported by the bicycle.

In some embodiments, an electronic device is disclosed for monitoring operations or properties of a bicycle or a component attached to the bicycle. The electronic device can include: a housing configured to mount to a top tube of a bicycle so that a portion of the housing is within the top tube when the housing is mounted to the bicycle, the portion including a hole configured to receive a fastener to secure the housing to the top tube; a connector supported by the housing and configured to receive data indicative of operations or properties of the bicycle or a component attached to the bicycle; a processor positioned in the housing and configured to monitor the operations or properties to determine status information for presentation; and a display supported by the housing and configured to present the status information.

The electronic device of the preceding paragraph can include one or more of the following features: The housing may include no holes configured to receive fasteners to secure the housing to the top tube other than the hole. The portion can include a spring configured to press against an inner surface of the top tube to secure the housing to the top tube. The spring can be positioned on a first end of the portion, and the hole can be positioned on a second end of the portion. The first end can be opposite the second end. The housing can include a lip around a perimeter of the housing, the lip being configured to cover a gap between the housing and the top tube when the housing is mounted to the bicycle. The lip can include rubber. Any electrical connections supported by the housing can be positioned in the top tube when the housing is mounted to the bicycle.

BRIEF DESCRIPTION OF THE DRAWINGS

The above-mentioned aspects, as well as other features, aspects, and advantages of the present technology will now be described in connection with various embodiments, with reference to the accompanying drawings. The illustrated embodiments, however, are merely examples and are not intended to be limiting Like reference numbers and designations in the various drawings indicate like elements.

DETAILED DESCRIPTION

Figure 1A:
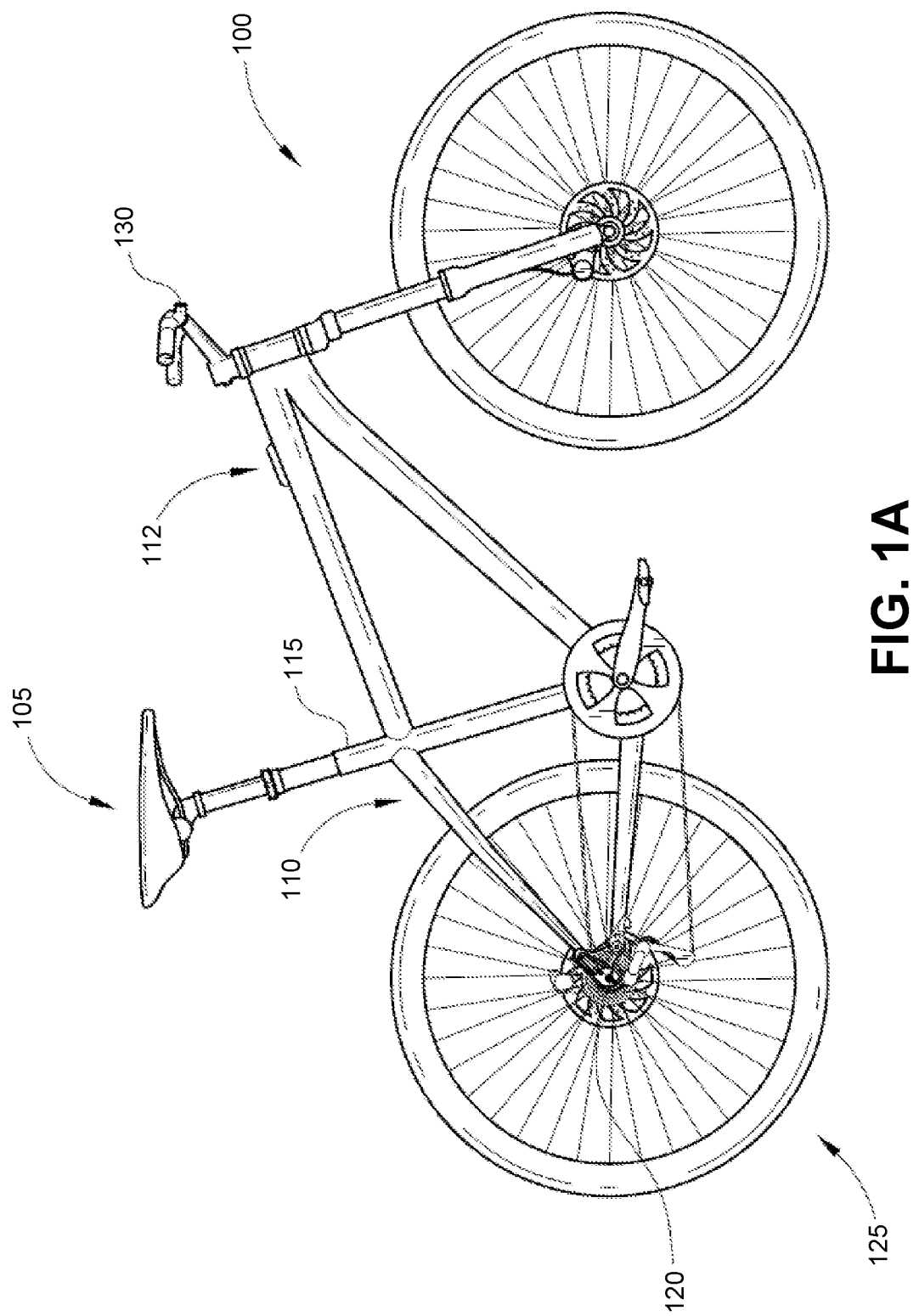
FIG. 1A illustrates a side view of a bicycle with an example in-tube mounted electronic device.

In the following detailed description, reference is made to the accompanying drawings, which form a part of the present disclosure. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and form part of this disclosure. For example, a system or device may be implemented or a method may be practiced using any number of the aspects set forth herein. In addition, such a system or device may be implemented or such a method may be practiced using other structure, functionality, or structure and functionality in addition to or other than one or more of the aspects set forth herein. Alterations and further modifications of the inventive features illustrated herein, and additional applications of the principles of the inventions as illustrated herein, which would occur to one skilled in the relevant art and having possession of this disclosure, are to be considered within the scope of the invention.

Descriptions of unnecessary parts or elements may be omitted for clarity and conciseness, and like reference numerals refer to like elements throughout. In the drawings, the size and thickness of layers and regions may be exaggerated for clarity and convenience.

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus, system or method according to some of the described embodiments can have several aspects, no single one of which necessarily is solely responsible for the desirable attributes of the apparatus, system or method. After considering this discussion, and particularly after reading the section entitled "Detailed Description" one will understand how illustrated features serve to explain certain principles of the present disclosure.

Introduction

This application is directed at least in part to embodiments of an electronic device (sometimes referred to as a human machine interface) that is mounted in and to a frame of a bicycle, such as an electric bicycle, and used to monitor operations or properties of the bicycle or one or more components associated with the bicycle. The electronic device can, for example, be mounted in a top tube of the bicycle and have an aesthetically clean appearance. The electronic device may be able to integrate and communicate with a variety of components including sensors to facilitate customization of monitoring by the electronic device. The electronic device moreover can be relatively inexpensive, and any connectors of electronic device can be designed to be protected against environmental conditions, such as water, when the electronic device are mounted to the bicycle.

The electronic device can desirably have a relatively minimalist design. The electronic device, in some embodiments, may include a display that does not present alphanumeric characters to an operator. The display can include multiple indicators that individually or in combination present information to the operator, such as the level of charge of one or more batteries or an operating mode of the electronic device or bicycle. The multiple indicators can, for example, include multiple light emitting diodes (LEDs). In some implementations, the display may not include a liquid-crystal display (LCD) like a thin-film-transistor (TFT) LCD. The electronic device can include one or two user input elements, such as buttons, for the operator to directly provide user inputs (for instance, an on/off input to activate or deactivate the bicycle or a mode change input for adjusting a mode of the electronic device or bicycle) to the electronic device. In some implementations, the electronic device may not include more than two user input elements for the operator to directly provide user inputs to the electronic device.

The electronic device can, in certain embodiments, include one connector for receiving data and power from the bicycle or one or more components associated with the bicycle. The electronic device can additionally include another connector for receiving inputs from a remote control device like a handle bar mounted control device. The remote control device can include one or more switches and may connect a data wire to ground when a corresponding one of the switches is pressed. In some implementations, the remote control device may not include any transistors or intelligent components, such as a microprocessor. The electronic device can also include a diagnostic port for servicing or diagnosing any issues with electronic device. The diagnostic port may be hidden when the electronic device is mounted to the bicycle, and the electronic device can include a cover, such as a rubber seal, over the diagnostic port to protect against water entering the diagnostic port when not in use. Further, the electronic device can include a wireless communication interface for wirelessly communicating with other devices and may transmit information such as speed, battery charge, or selected mode using one or more protocols, like ANT+™ or Bluetooth™. The diagnostic port or wireless interface communications can be used to tune, diagnose, or update the electronic device, bicycle, or one or more other components assisted with the bicycle, as well as collect and remotely store data gathered by the electronic device.

The electronic device can have a housing configured to be at least partly mounted in a top tube of a bicycle. The housing can be secured to the top tube by bolting the housing to the top tube on one side of the housing and securing another side of the housing with the spring from inside the top tube. This design desirably, in certain embodiments, can facilitate quick and easy drop in and mounting of the housing to the top tube with the use of no more than one fastener, such as a bolt or screw, that passes through a hole in the housing. In addition, this design advantageously, in certain embodiments, can allow for a large tolerance in top tube wall thickness and shape, as well as a length and width of the cutout for the electronic device in the top tube. The housing can further include a perimeter lip to cover a gap between the electronic device in the top tube. The lip can, for instance, be composed of rubber or plastic. The electronic device can moreover be designed so that any connectors or cables extending from the electronic device are positioned within the top tube when the electronic devices mounted to the top tube.

The electronic device can be set to a mode in which the display presents for a period of time (such as a 2, 3, 5, or 10 seconds) certain information in response to a user input, but otherwise does not present the certain information. This mode can be termed a dark mode and may be set according to instructions received from another device, such as instructions provided by an application running on a smart phone.

The electronic device can include a display that presents a state of charge of one or more batteries in percentage increments (such as 5%, 10%, or 20% increments). Each percentage increment can be denoted by a separate indicator, and activation of one or more indicators can denote a state of charge that at least meets a threshold level corresponding to the activated indicators. The display can further simultaneously present the state of charge of two batteries. The state of charge of one of the two batteries can be presented in a different color from the state of charge of the other of the two batteries. In addition, the state of charge of one of the two batteries can be overlaid on the other of the two batteries such that the battery having the lower state of charge is shown on top. When the state of charge of both of the two batteries may be below a threshold level, a single combined indicator can be used to represent a dual low battery condition.

The electronic device can continuously monitor the bicycle and one or more components associated with the bicycle when the bicycle is in operation. If any errors occur during operation, the electronic device can store a snapshot associated with the error so that the snapshot can be later used for analysis or troubleshooting. The electronic device can also record in log files gathered bike-related data, such as speed, cadence, location, selected mode, or motor temperature. The log files can then be used to analyze rides or provide the bike-related data to platforms, such as social platforms like STRAVA™. In some implementations, the record function can be switched off by default and may be activated by an operator before being initiated. Advantageously, in certain embodiments, one or more of these features of the electronic device can obviate the need for bringing a smart phone when riding the bicycle because the electronic device can automatically and easily handle gathering of data about rides.

The electronic device can be reset in some instances without utilizing a separate tool, such as an application, diagnostic, or other communication with another device. The electronic device can, for example, be reset by an operator holding one of the user input elements for a period of time (for example, 2, 3, 5, or 10 seconds) during startup of the electronic device. The reset can desirably reset system parameters, such as those parameters that may be adjusted by an operator, and may be useful in instances like transferring of the electronic device or bicycle to another operator.

The electronic device can also facilitate the addition of one or more lights to the bicycle. An in-line Y splitter can be connected to a connector of the electronic device, which may route one or more voltage and ground lines for the one or more lights.

Bicycle System with In-Tube Mounted Electronic Device

FIG. 1A illustrates a side view of a bicycle 100, such as an electric bicycle. The bicycle 100 can include a seat 105 and a frame 110. The seat 105 can be supported by a seat tube 115. An electronic device 112 can be mounted to the frame 110 and positioned at least partly in a top tube of the frame 110 that extends between the seat tube 115 and handle bar mount. The bicycle 100 also can include a rear axle 120 of a rear wheel assembly 125. A motor can be positioned proximate the rear wheel assembly 125 for imparting motion to the bicycle 100, and one or more sensors can be positioned proximate the rear wheel assembly 125 or the front wheel assembly for monitoring operations or properties of the bicycle 100. A remote control device 130 can be attached to handle bars of the bicycle 100 and used to control the electronic device 112.

Figure 1B:
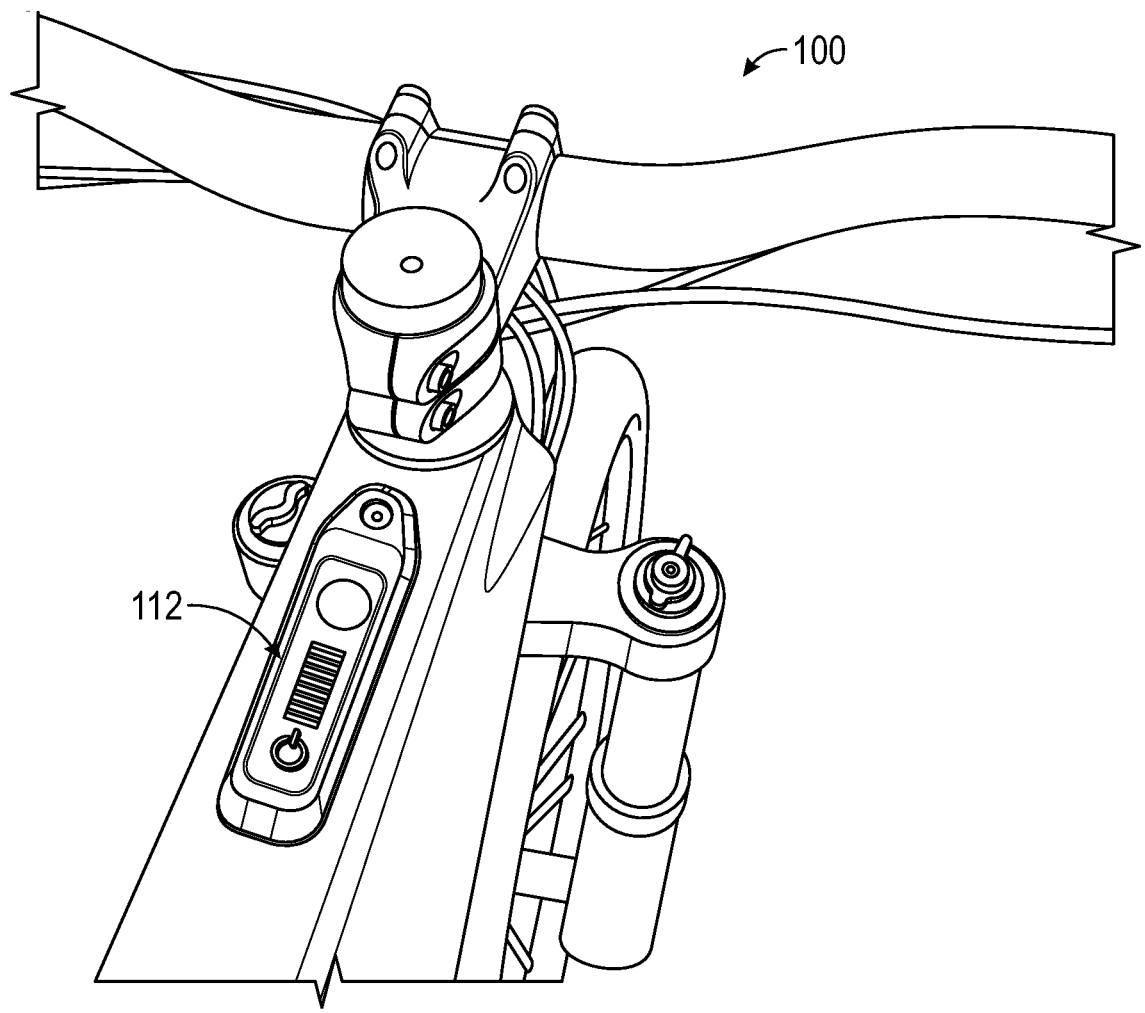
FIG. 1B illustrates a seat perspective view of the bicycle with the in-tube mounted electronic device of FIG. 1A.

FIG. 1B illustrates a view of the bicycle 100 of FIG. 1A from the perspective of a rider sitting in the seat 105 and viewing the handle bars and the electronic device 112 mounted to the top tube.

Figure 2A:
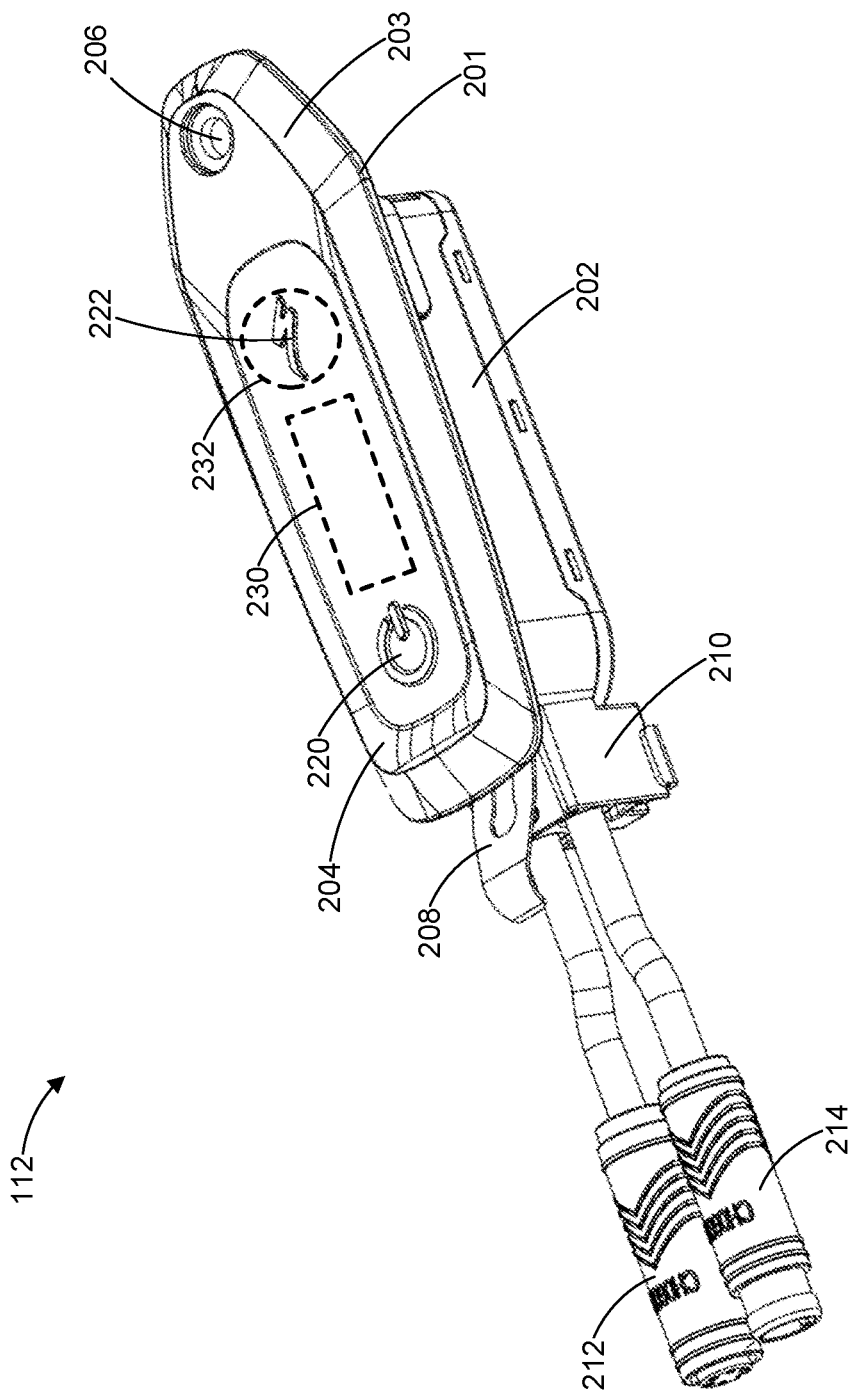
FIG. 2A illustrates a top perspective view of the in-tube mounted electronic device of FIG. 1A.

FIG. 2A illustrates a top perspective view of the electronic device 112 of FIG. 1A. The electronic device 112 includes a housing that has an upper portion 201 and a lower portion 202. When the electronic device 112 is mounted to the bicycle, the lower portion 202 can be positioned within the frame 110 and the upper portion 201 can be positioned above the frame 110 and visible when viewing an outer surface of the bicycle 100. The upper portion 201 can include a downward sloping portion 203 and an inwardly sloping portion 204. The upper portion 201 may include a hole 206 usable for securing the upper portion 201 to the frame 110 with a fastener like a bolt or screw.

The lower portion 202 can include a spring 208 configured to press against an inner surface of the frame 110 to secure the electronic device 112 to the top tube. The spring 208 can, for example, be a plate spring. The lower portion 202 can additionally include a connector 210. The connector 210 can be an analog connector and may include a first cable 212 (such as a HIGO 6-pole female cable) and a second cable 214 (such as a HIGO 5-pole male cable) for receiving data or power from or transmitting data or power to the bicycle 100 or one or more other components associated with the bicycle.

The upper portion 201 can include a first user interface element 220 and a second user interface element 222. The first user interface element 220 can, for example, be used to receive a user input to activate or deactivate the bicycle 100, such as a motor of the bicycle 100 or one or more components associated with the bicycle 100. The second user interface element 222 can, for instance, be used to receive a user input to switch modes for the bicycle 100 or one or more other components associated with the bicycle 100.

The upper portion 201 can further include a first display area 230 and a second display area 232. The first display area 230 can be used to display a level of charge of one or more batteries associated with (for example, supported by) the bicycle 100, such as is described in greater detail with respect to FIG. 6. The second display area 232 can be used to indicate whether the electronic device 112 or the bicycle 100 is activated or to identify a mode of operation for the electronic device 112 or the bicycle 100.

Figure 2B:
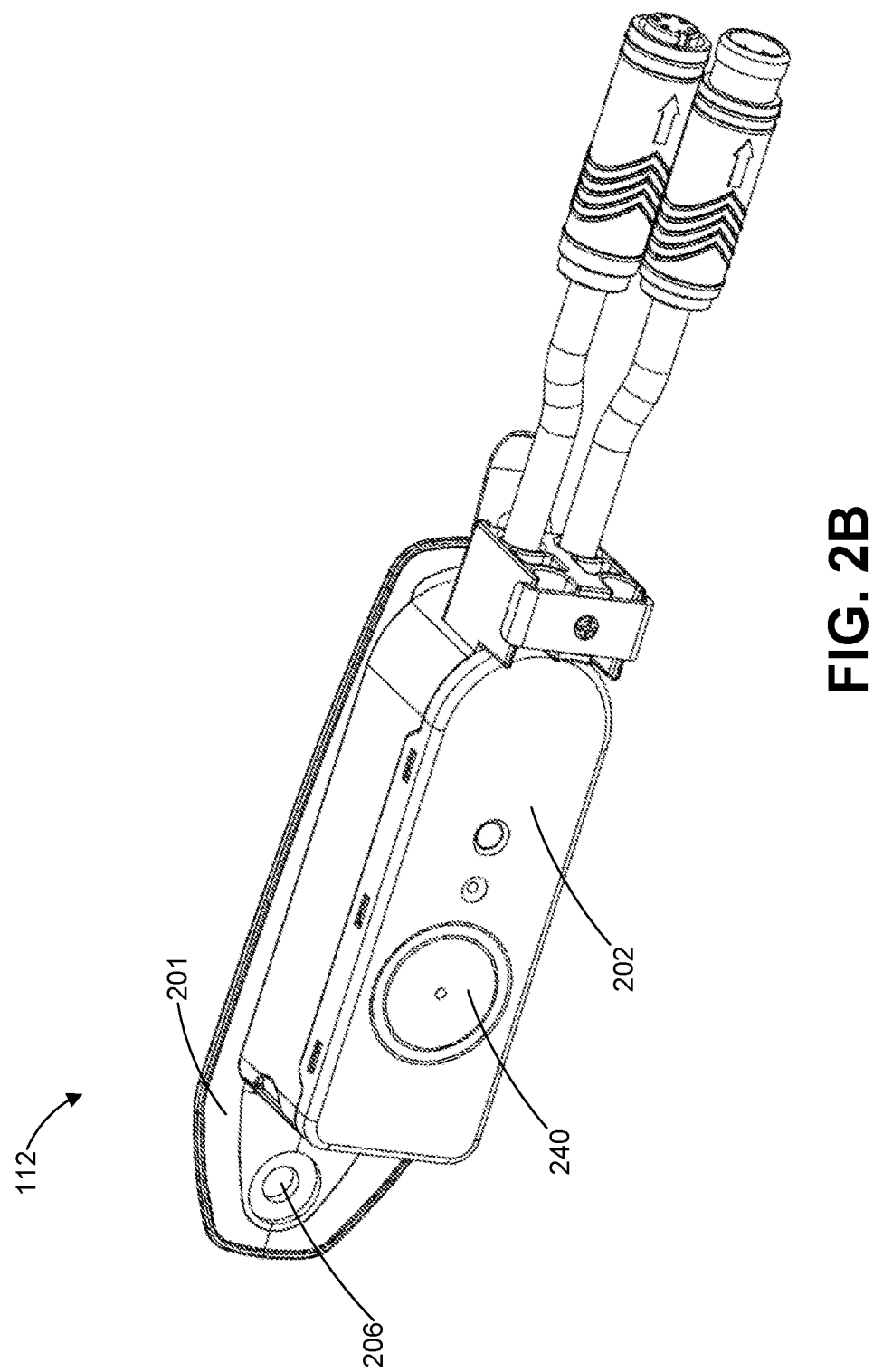
FIG. 2B illustrates a bottom perspective view of the in-tube mounted electronic device of FIG. 1A.

FIG. 2B illustrates a bottom perspective view of the electronic device 112 of FIG. 1A. The lower portion 202 can include a speaker 240, such as a beeper, for outputting information audibly to an operator.

Figure 2C:
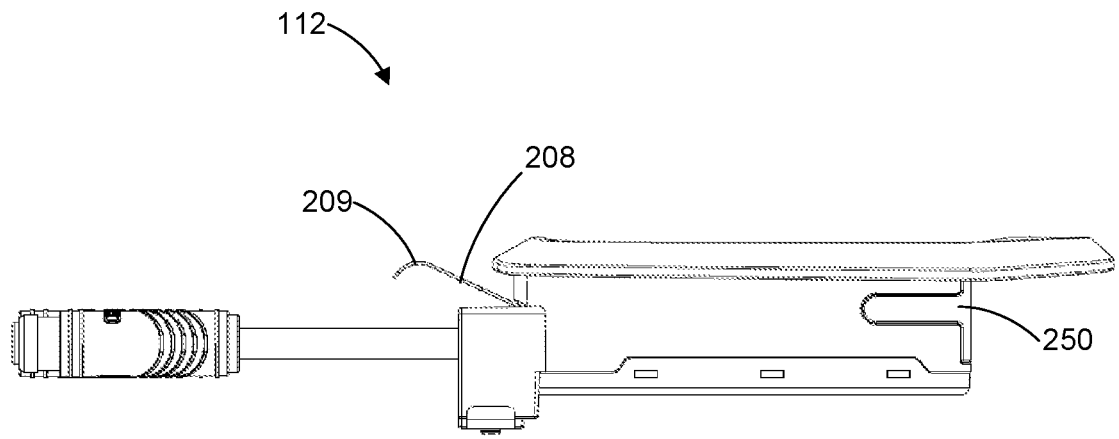
FIGS. 2C and 2D illustrate side perspective views of the in-tube mounted electronic device of FIG. 1A.
Figure 2D:
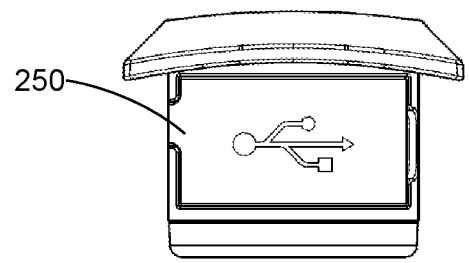

FIGS. 2C and 2D illustrate side perspective views of the electronic device 112 of FIG. 1A. As can be seen from FIG. 2C, the spring 208 can include a point 209 that is configured to contact and apply force against the inner surface of the frame 110 to secure the electronic device 112 to the frame 110. The electronic device 112 can include a diagnostic port positioned behind a cover 250 as shown in FIGS. 2C and 2D. The diagnostic port can be used to service and perform diagnostics on electronic device 112, the bicycle 100, or one or more components associated with the bicycle 100. In one implementation, the diagnostic port can be a Universal Serial Bus (USB) port.

Figure 3A:
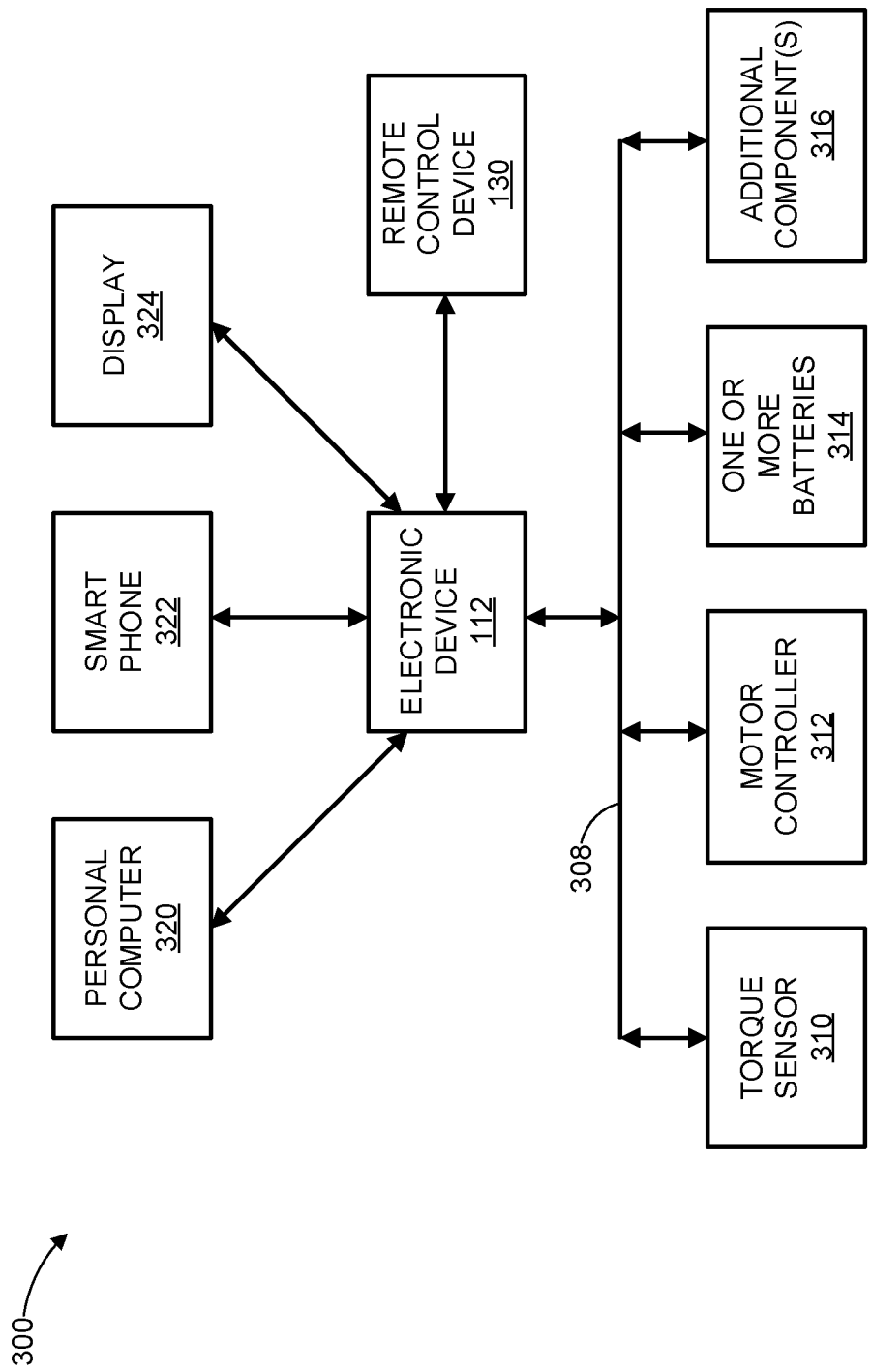
FIG. 3A illustrates an example environment in which the in-tube mounted electronic device of FIG. 1A can communicate with other devices.

FIG. 3A illustrates an environment 300 in which the electronic device 112 of FIG. 1A may communicate with other devices. As shown, the electronic device 112 can communicate via a medium, such as a Controller Area Network (CAN bus) or other channel, with a torque sensor 310, a motor controller 312, one or more batteries 314, and one or more additional components 316. The electronic device 112 can additionally communicate via wired or wireless communications with the remote control device 130, a personal computer 320, a smart phone 322, and a display 324.

The electronic device 112 can receive a torque signal from the torque sensor 310 that is indicative of a torque at the rear axle 120 or another part of the bicycle 100. The electronic device 112 may communicate with the motor controller 312 so that the electronic device 112 can monitor operations or properties of the motor controller 312 or provide control commands to adjust operations by the motor controller 312. The electronic device 112 can receive one or more batteries signals from the one or more batteries 314 that is indicative of a level of charge of the one or more batteries 314. For instance, the one or more batteries 314 can include two batteries, and the electronic device can receive one battery signal from each of the two batteries to determine the level of charge of the individual batteries.

Figure 3B:
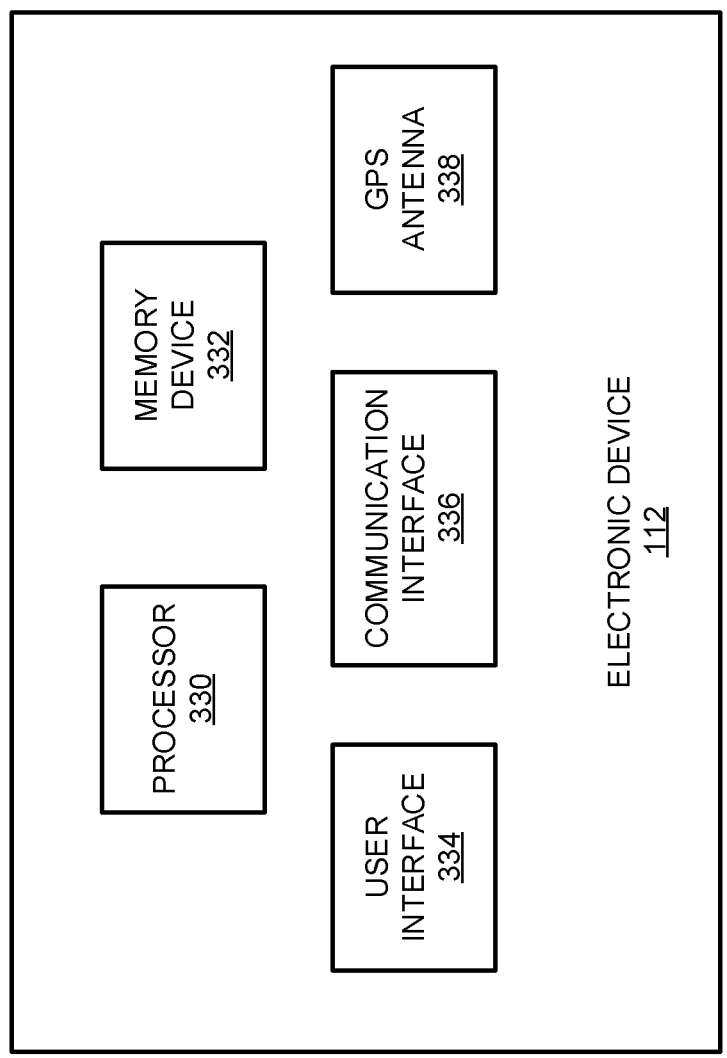
FIG. 3B illustrates an example components of the in-tube mounted electronic device of FIG. 1A.

FIG. 3B illustrates an example components of the electronic device 112 of FIG. 1A. The electronic device 112 can include a processor 330, a memory device 332, a user interface 334, a communication interface 336, and a Global Positioning System (GPS) antenna 338. The processor 330 can control operations of the electronic device 112 according to executable instructions stored in the memory device 332. The processor 330 may also store gathered bike data to the memory device 332. The user interface 334 can receive user inputs from an operator, such as via selection of the first user interface element 220 and the second user interface element 222 by the operator. The communication interface 336 can facilitate wired or wireless communications between the electronic device 112 and other devices. The GPS antenna 338 can provide a location of the electronic device 112, such as geographical coordinates corresponding to the location of the electronic device 112 over time.

Figure 4A:
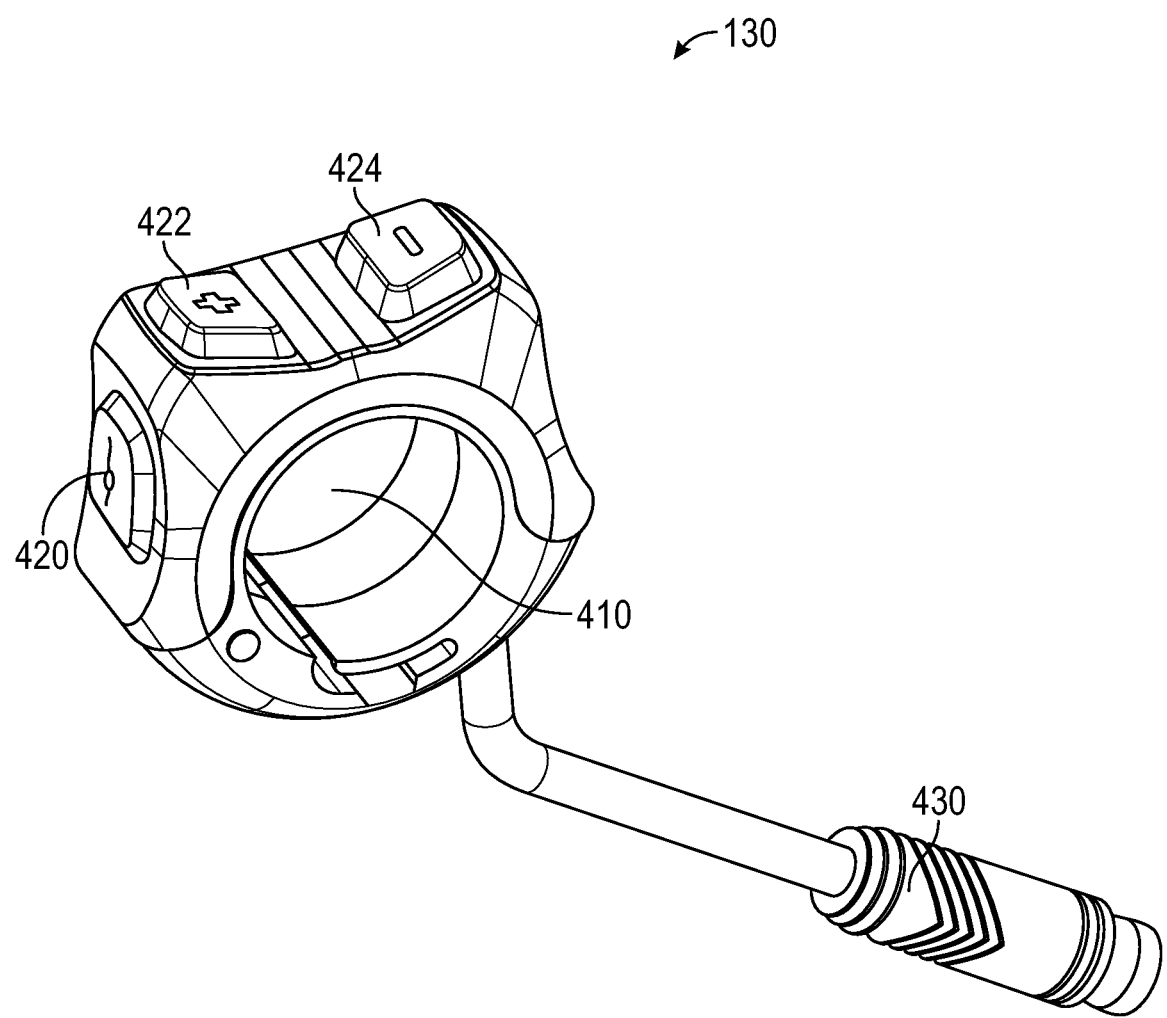
FIGS. 4A and 4B illustrate perspective views of an example remote control device that may communicate with the in-tube mounted electronic device of FIG. 1A.
Figure 4B:
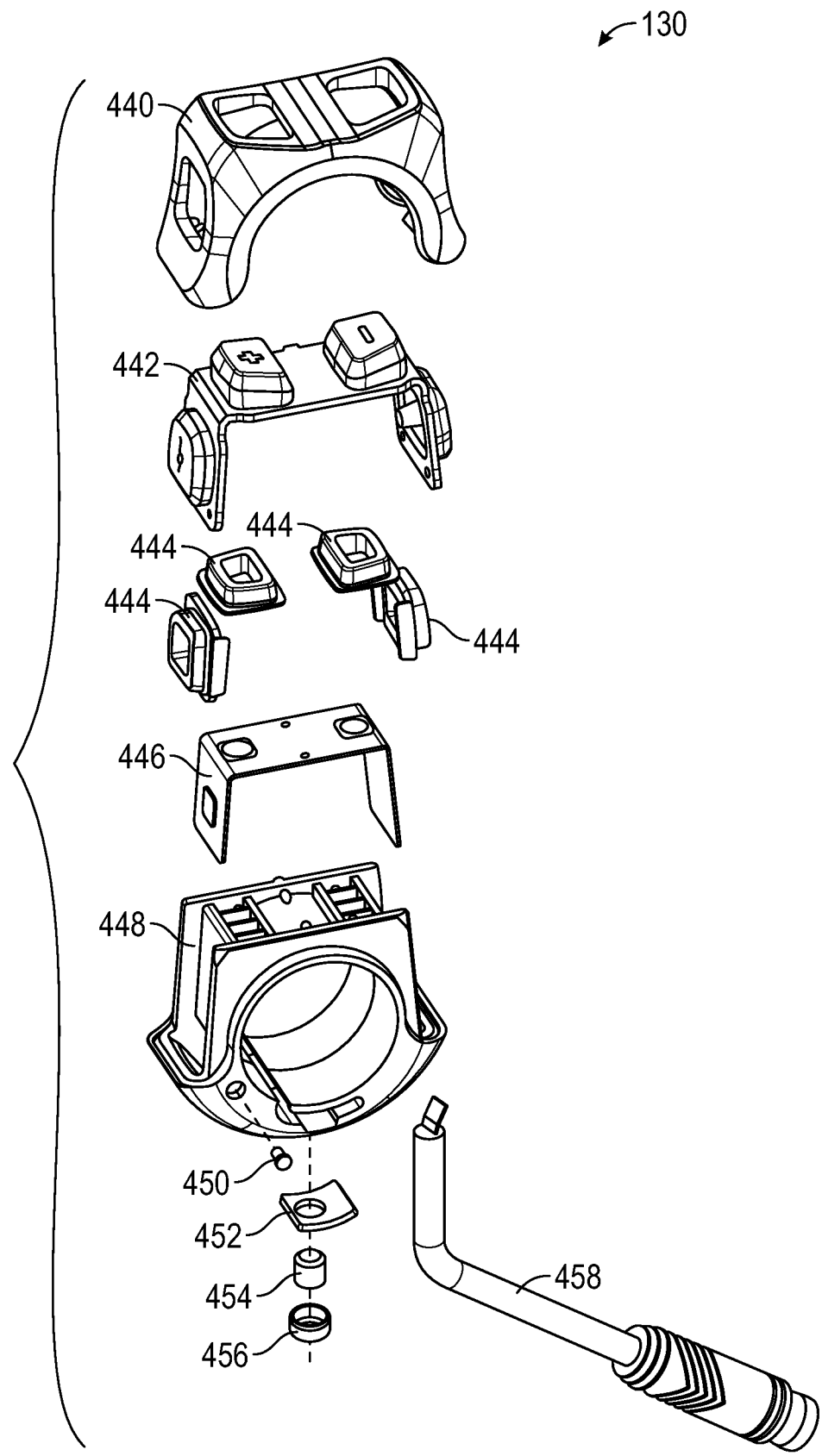

FIGS. 4A and 4B illustrate perspective views of the remote control device 130. The remote control device 130 can be attached to the handle bars of the bicycle 100 by positioning and securing the handle bars in the hole 410. The remote control device 130 can include multiple remote user interface elements, including a first remote user interface element 420, a second remote user interface element 422, and a third remote user interface element 424 for receiving user inputs to control operations of the electronic device 112. The remote control device 130 can transmit control signals to the electronic device 112 via a connector 430 of the remote control device 130. Each of the first remote user interface element 420, the second remote user interface element 422, and the third remote user interface element 42 can, for instance, include a switch that connects a different data wire to ground when the switch is pressed. In some implementations, the remote control device 130 may not include any transistors or intelligent components, such as a microprocessor. As can be seen from the tear down of the remote control device 130 in FIG. 4B, the remote control device 130 can include a top housing 440, rubber keys 442, internal plugs 444, flexible printed circuits (FPCs) with clickers 446, a bottom housing 448, a seal plug 450, a nut plate 452, a screw 454, a bushing 456, and a cable 458.

Figure 5:
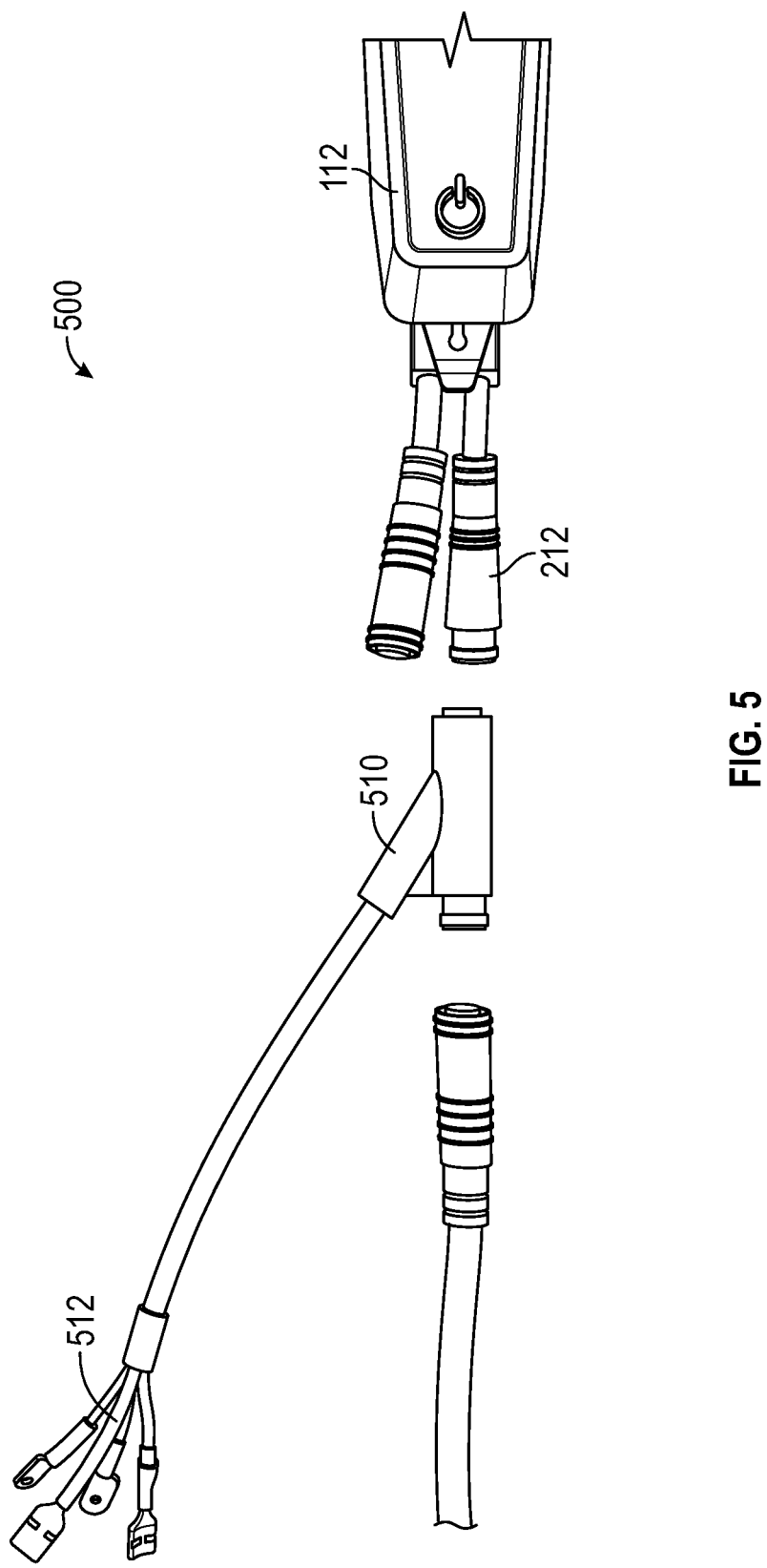
FIG. 5 illustrates a configuration for connecting one or more lights to the in-tube mounted electronic device of FIG. 1A.

FIG. 5 illustrates a configuration 500 for connecting one or more lights to the electronic device 112 of FIG. 1A. The first cable 212 can be connected to a Y splitter 510. The ends 512 of the Y splitter 510 can be connected to the one or more lights and provide voltage and ground wires for the one or more lights.

Figure 6:
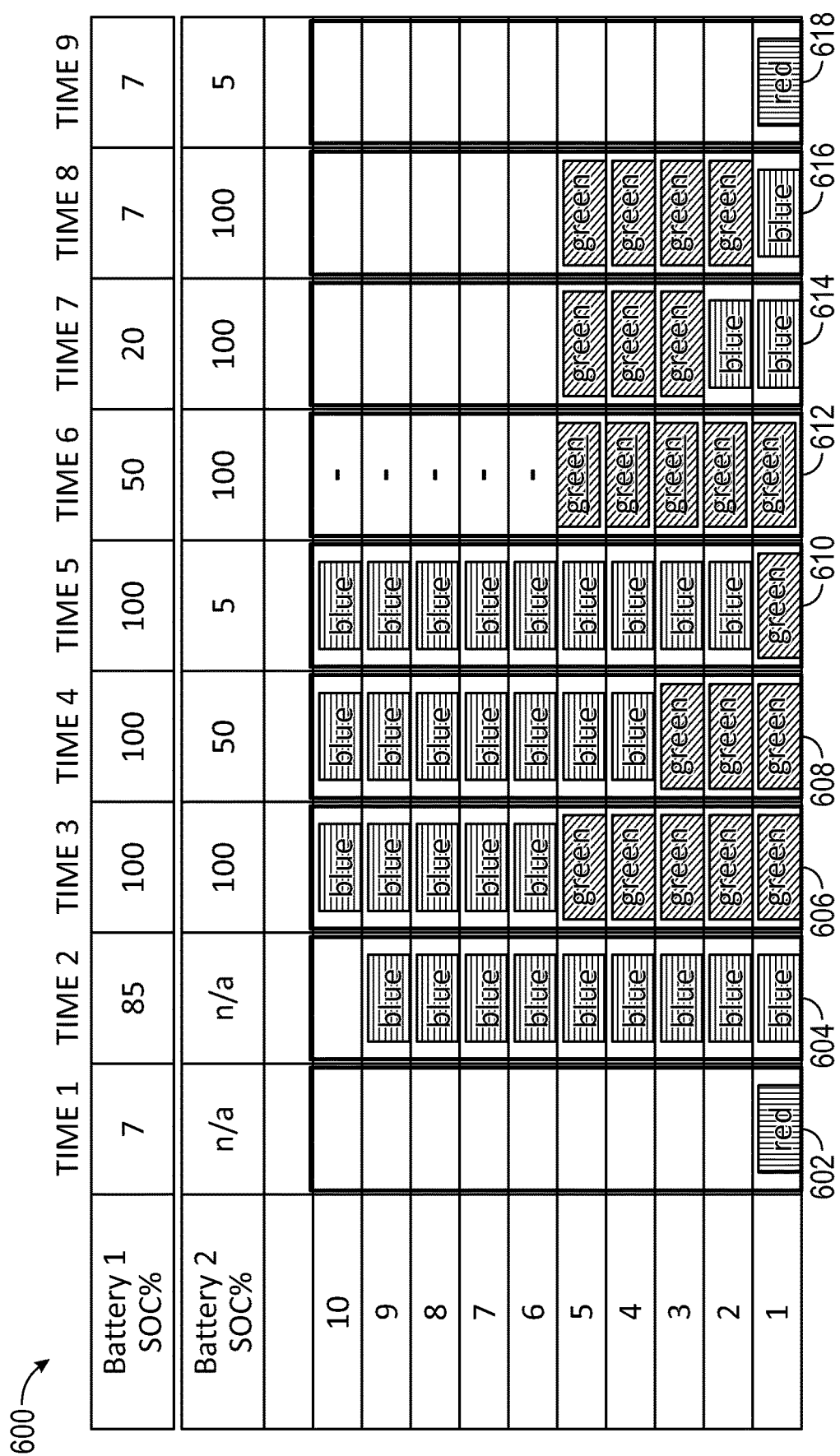
FIG. 6 illustrates example battery status displays by the in-tube mounted electronic device of FIG. 1A.

FIG. 6 illustrates battery status displays 600 by the electronic device 112 of FIG. 1A. The battery status displays 600 in particular can be presented in the first display area 230 shown in FIG. 2A.

The Battery 1 State of Charge Percentage (SOC %) row and the Battery 2 SOC % row indicate the state of charge (sometimes referred to as a level of charge) of battery 1 and battery 2 over times 1-9 as numerical percentages. For example, at times 3, 7, and 9, battery 1 can respectively have a state of charge of 100%, 20%, and 7%, and at times 3, 7, and 9, battery 2 can respectively have a state of charge of 100%, 100%, and 5%.

The 1-10 rows indicate the state of charge of the two batteries in the form of activated, colored indicators (such as LEDs) that correspond to the numerical percentages listed in the corresponding time column. Notably, a presented scale for battery 1 may be different from the presented scale for battery 2 (for instance, 100% state of charge for battery 1 can be indicated by activating all 1-10 of the indicators so each indicator represents an around 10% increase in charge while 100% state of charge for battery 2 can be indicated by activating all 1-5 of the bottom indicators so that each indicator represents an around 20% increase in charge). Moreover, the indicators for battery 1 can be presented in a different color from the indicators for battery 2. In one example, at time 3, all 1-10 of the blue indicators can be activated corresponding to the 100% state of charge for battery 1, and all 1-5 of the green indicators can be activated corresponding to the 100% state of charge for battery 2. In another example, at time 7, 1 and 2 of the blue indicators can be activated corresponding to the 20% state of charge for battery 1, and all 1-5 of the green indicators can be activated corresponding to the 100% state of charge for battery 2. In yet another example, at time 9, a single combined red indicator can be presented indicating that both batteries are below threshold levels, such as a 10% state of charge.

Accordingly, at time 1, the first display area 230 can appear as shown in box 602. At time 2, the first display area 230 can appear as shown in box 604. At time 3, the first display area 230 can appear as shown in box 606. At time 4, the first display area 230 can appear as shown in box 608. At time 5, the first display area 230 can appear as shown in box 610. At time 6, the first display area 230 can appear as shown in box 612. At time 7, the first display area 230 can appear as shown in box 614. At time 8, the first display area 230 can appear as shown in box 616. At time 9, the first display area 230 can appear as shown in box 618.

The first display area 230 can simultaneously present the state of charges of battery 1 and battery 2 so that the state of charge of one of battery 1 or battery 2 is overlaid on the state of charge of the other of battery 1 or battery 2. The first display area 230 can moreover present the state of charges of battery 1 and battery 2 such that the battery having the lower state of charge is shown overlaid on top. In other embodiments, the battery having the higher state of charge may instead by shown overlaid on top. Moreover, the state of charge of one of battery 1 or battery 2 may be presented with a smaller width than the state of charge of the other of battery 1 or battery 2 (for example, as illustrated where the state of charge of battery 1 has a smaller width than the state of charge of battery 2).

Other Embodiments and Terminology

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, for example, a combination of a DSP and a microprocessor, a plurality of microprocessors, one or more microprocessors in conjunction with a DSP core, or any other such configuration.

The steps of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable storage medium known in the art. An example storage medium can be connected to the processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

Conditional language used herein, such as, among others, "can," "might," "may," "for example," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Conjunctive language such as the phrase "at least one of X, Y and Z," unless specifically stated otherwise, is otherwise understood with the context as used in general to convey that an item, term, etc. may be either X, Y or Z. Thus, such conjunctive language is not generally intended to imply that certain embodiments require at least one of X, at least one of Y and at least one of Z to each be present.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

What is claimed is:

1. An electronic system for monitoring operations or properties of a bicycle or a component attached to the bicycle, the electronic system comprising:
   a remote control device configured to connect a data wire to a ground responsive to a user action, the remote control device not comprising any transistors;
   a housing configured to mount to a top tube of a bicycle so that a portion of the housing is within the top tube when the housing is mounted to the bicycle, the portion comprising a port configured to permit diagnosing or servicing of errors, the housing comprising a cover configured to selectively cover the port, the housing comprising no more than two switches configured to receive user inputs;
   a wireless interface supported by the housing and configured wirelessly communicate with other devices;
   a connector supported by the housing and configured to receive data indicative of operations or properties of the bicycle or a component attached to the bicycle;
   a processor positioned in the housing, the processor being configured to:
      communicate with the remote control device via the connector,
      monitor the operations or the properties to determine status information, and
      store at least some of the data to a memory device; and
   a display supported by the housing and configured to present the status information without using alphanumeric characters,
   wherein the display does not comprise a liquid-crystal display,
   wherein the user inputs comprise a reset input configured to reset system parameters, the reset input being received responsive to selection of at least one of the no more than two switches for a period of time during startup of the processor.

2. The electronic system of claim 1, wherein the display comprises a plurality of light emitting diodes to present the status information.

3. The electronic system of claim 1, wherein the no more than two switches are two buttons, and the user inputs comprise activation inputs, deactivation inputs, and settings adjustment inputs.

4. The electronic system of claim 1, wherein the period of time is at least 5 seconds.

5. The electronic system of claim 1, wherein the operations or the properties comprise a speed, a cadence, a location, and a mode of the bicycle.

6. The electronic system of claim 5, wherein the processor is configured to output at least some of the data to another device via the wireless interface.

7. The electronic system of claim 1, wherein the processor is configured to communicate via a controller area network to monitor the operations or the properties.

8. The electronic system of claim 1, wherein the processor is configured to receive a signal from the remote control device responsive to the remote control device connecting the data wire to the ground.

9. The electronic system of claim 8, wherein the processor is configured to control at least one of the operations responsive to the signal.

10. The electronic system of claim 1, wherein the housing comprises no more than one hole that is configured to receive a fastener to secure the housing to the top tube.

11. The electronic system of claim 1, wherein the port comprises a serial bus interface.

12. The electronic system of claim 1, further comprising the bicycle, the housing being configured to mount to the top tube so that any electrical connections supported by the housing are protected in the top tube from splashes of water external to the bicycle when the housing is mounted to the bicycle.

13. The electronic system of claim 1, wherein, responsive to the bicycle turning on, the processor is configured to automatically store at least some of the data to the memory device.

14. The electronic system of claim 1, wherein the processor is configured to not automatically store at least some of the data to the memory device until instructed by a user to automatically store at least some of the data to the memory device.

15. The electronic system of claim 1, wherein the connector is configured to receive power from the bicycle or the component.

16. The electronic system of claim 1, wherein the display comprises a first display area and a second display area separate from the first display area.

17. The electronic system of claim 16, wherein the first display area is configured to present a different type of information from the second display area.

18. The electronic system of claim 16, wherein the first display area is configured to present a level of charge of a power source, and the second display area is configured to present an activation indication or a mode indication associated with the bicycle or the component.

19. The electronic system of claim 16, wherein a first switch of the no more than two switches is positioned within the first display area, and the second display area is positioned between the first switch and a second switch of the no more than two switches.

20. The electronic system of claim 1, further comprising a speaker configured to audibly present the status information.

* * * * *